(12) United States Patent
Mitchell et al.

(10) Patent No.: US 9,415,508 B1
(45) Date of Patent: Aug. 16, 2016

(54) MULTI-LINK SUBSTRATE SCANNING DEVICE

(71) Applicant: Varian Semiconductor Equipment Associates, Inc., Gloucester, MA (US)

(72) Inventors: Robert J. Mitchell, Winchester, MA (US); William Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/713,456

(22) Filed: May 15, 2015

(51) Int. Cl.
*B25J 9/12* (2006.01)
*B25J 9/10* (2006.01)
*B25J 9/06* (2006.01)
*B25J 9/16* (2006.01)

(52) U.S. Cl.
CPC .. *B25J 9/126* (2013.01); *B25J 9/06* (2013.01); *B25J 9/102* (2013.01); *B25J 9/1694* (2013.01); *Y10S 901/09* (2013.01); *Y10S 901/23* (2013.01)

(58) Field of Classification Search
USPC ............................ 250/442.11, 440.11, 492.21
See application file for complete search history.

(56) References Cited

U.S. PATENT DOCUMENTS

| | | | |
|---|---|---|---|
| 6,900,444 B2 | 5/2005 | Ferrara et al. | |
| 6,987,272 B2 | 1/2006 | Ota et al. | |
| 2005/0218336 A1* | 10/2005 | Mori | H01J 37/3171 250/440.11 |
| 2008/0142726 A1* | 6/2008 | Relleen | H01J 37/20 250/400 |

* cited by examiner

*Primary Examiner* — Kiet T Nguyen (57) ABSTRACT

A substrate scanning device includes first, second and third linkages, and a direct drive motor coupled between a process chamber and a first end of the first linkage. A first gear motor coupled between a second end of the first linkage and a first end of the second linkage and a second gear motor coupled between a second end of the second linkage and a first end of the third linkage. A substrate support surface coupled to a second end of the third linkage. The direct drive motor for moving the substrate support surface parallel to a scan axis as the direct drive motor moves the substrate support surface along the scan axis. The first and second gear motors can be configured to maintain the substrate support surface in a plane approximately parallel with the scan axis.

20 Claims, 9 Drawing Sheets

MULTI-LINK SUBSTRATE SCANNING DEVICE

FIELD OF THE DISCLOSURE

Embodiments of the present disclosure relate generally to substrate handling devices, and more particularly to a multi-link substrate scanning device having improved scan velocity performance.

BACKGROUND OF THE DISCLOSURE

Ion implantation is a technique for introducing property-altering impurities into substrates. During a typical ion implantation process, a desired impurity material is ionized in an ion source, the ions are accelerated to form an ion beam of prescribed energy, and the ion beam is directed at the surface of a substrate. The energetic ions in the ion beam penetrate into the sub-surface of the substrate material and are embedded into the crystalline lattice of the substrate material to form a region of desired conductivity or material property. The process of embedding or implanting ions into the crystalline lattice of the substrate material is also known as "doping" the substrate.

An ion implanter may generate an ion beam having a roughly circular or elliptical cross sectional shape that is smaller than the surface of a substrate to be treated. A substrate, which may be a semiconductor, for example, may have a round, disk shape. A substrate scanning device or substrate scanning device may dope a substrate, such as a substrate, by exposing it to the ion beam generated by the ion implanter.

In order to implant ions into the entire surface of a substrate, the substrate may be mechanically driven or "scanned" in a direction along a scan axis that is orthogonal to the direction of an ion beam projected thereon. For example, if an ion beam is projected along a horizontal plane toward a vertically-oriented substrate, the substrate may be scanned in a vertical direction and/or in a lateral direction that is perpendicular to the projected ion beam.

The entire surface of the substrate may be exposed to the relatively smaller ion beam during an implantation process. The substrate scanning device serially exposes portions of the substrate surface to the ion beam. The implantation process is completed when the substrate has been doped with a predetermined "dose" of ions. Proper dosing is a delicate and precise process. Dose non-uniformities occur when portions of a substrate surface are exposed to the ion beam for varying amounts of time. Dose non-uniformities can result in a substrate with undesirable characteristics and poor performance.

Substrate scanning devices require excellent velocity performance to uniformly expose portions of a substrate, such as the surface of a substrate, to an ion beam and minimize dose non-uniformities. Inconsistent velocity performance can cause portions of a substrate surface to be exposed to the ion beam for varying amounts of time and result in dose non-uniformities in substrates. As manufacturing standards steadily increase, substrate scanning devices with improved velocity control, accuracy, and dexterity are needed to uniformly dope substrates in a quick and efficient manner. Thus, it would be advantageous to provide a solution for doping substrates in a uniform manner. An additional advantage would be to provide a solution for scanning a substrate at a constant velocity. It would be advantageous to provide a solution to exposing portions of a substrate to an ion beam predetermined amount of time. It would also be advantageous to provide a solution for quickly and efficiently doping substrates.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

An exemplary embodiment of a substrate scanning device in accordance with the present disclosure can include first, second and third linkages, and a first joint connectable between a process chamber and a first end of the first linkage. The first joint may include a direct drive motor. A second joint may be coupled between a second end of the first linkage and a first end of the second linkage. The second joint may include a first gear motor. A third joint may be coupled between a second end of the second linkage and a first end of the third linkage, and the third joint may include a second gear motor. A substrate holder can be coupled to a second end of the third linkage. The first joint may rotate the first link, while the second and third joints may maintain a face of the substrate holder at a constant position and orientation as the first joint moves the substrate holder along the scan axis. The radial motion of the first joint may displace the second and third joints in a direction perpendicular to the scan axis. In some embodiments the first, second and third joints may rotate their respective links to present the face of the substrate holder at an oblique angle with respect to an ion beam that impinges a substrate held by the substrate holder.

A substrate scanning device is disclosed, and may include a first joint comprising a direct drive motor. The first joint may be connectable to a process chamber. A second joint may include a first gear motor, and the first joint and the second joint may be connected by a first linkage. A third joint may include a second gear motor, and the second joint and the third joint can be connected by a second linkage. A substrate holder can be provided for engaging a substrate, and the third joint and the substrate holder can be connected by a third linkage. The first, second and third joints can be rotatable via the direct drive motor and the first and second gear motors, respectively, to move the substrate holder along a scan axis.

An exemplary method for introducing a substrate to an ion beam in accordance with the present disclosure may include: moving a substrate along a scan axis, rotating a first link about a first joint in a first direction or a second direction; rotating a second link about a second joint in a first direction when an angle between the first link and an X-axis is between −90 degrees and 0 degrees, and rotating the second link about the second joint in a second direction when the angle between the first link and the X-axis is between 0 degrees and 90 degrees; rotating a third link about a third joint in a first direction when an angle between the first link and the X-axis is between 0 degrees and 90 degrees, rotating the third link about the third joint in a second direction when the angle between the first link and the X-axis is between −90 degrees and 0 degrees; wherein rotating the first link and rotating the second link maintains the substrate at an orientation and position relative to a direction of an ion beam, wherein the direction of the ion beam is perpendicular to the scan axis.

BRIEF DESCRIPTION OF THE DRAWINGS

By way of example, various embodiments of the disclosed device will now be described, with reference to the accompanying drawings, in which.

DETAILED DESCRIPTION

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

Figure 1:
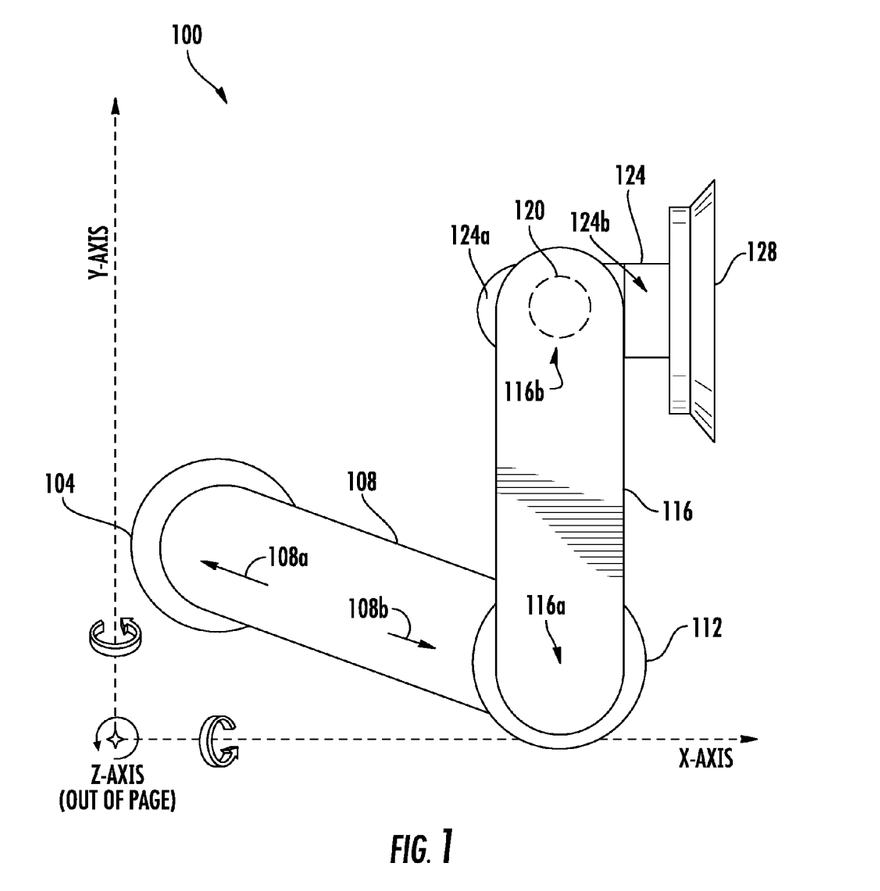
FIG. 1 is a side view illustrating an exemplary substrate scanning device in accordance with an embodiment of the present disclosure.

Referring to FIG. 1, a side view of a substrate scanning device 100 consistent with a non-limiting, exemplary embodiment of the present disclosure is shown. The substrate scanning device 100 can include a first joint 104, second joint 112, third joint 120, and substrate holder 128. The first joint 104 may be connected to the second joint 112 by a first linkage 108. The second joint 112 may be connected to the third joint 120 by a second linkage 116. The third joint 120 may be connected to the substrate holder 128 by a third linkage 124.

The first linkage 108 may have a first end 108a and a second end 108b. The first end 108a of the first linkage 108 may couple to the first joint 104. The second end 108b of the first linkage 108 may couple to the second joint 112. The first joint 104 can support the first linkage 108, second joint 112, second linkage 116, third joint 120, third linkage 124, and substrate holder 128. The first joint 104 may be used to manipulate the position and orientation of the substrate holder 128 by enabling the first end of the first linkage 108 to rotate about the first joint.

The second linkage 116 may have a first end 116a and a second end 116b. The second joint 112 may couple to the first end 116a of the second linkage 116. The second end 116b of the second linkage 116 may couple to the third joint 120. The second joint 112 can support the second linkage 116, third joint 120, third linkage 124, and the substrate holder 128. The second joint 112 may be used to manipulate the position and orientation of the substrate holder 128 by enabling the first end 116a of the second linkage 116 to be rotated about the second joint.

The third linkage 124 may have a first end 124a and a second end 124b. The first end 124a of the third linkage 124 may be coupled to the third joint 120. The second end 124b of the third linkage 124 may be coupled to the substrate holder 128. The substrate holder 128 may have features enabling it to engage and retain a substrate (not shown) which in one non-limiting exemplary embodiment is a semiconductor wafer. In some embodiments the substrate holder 128 can include an electrostatic clamp to engage and retain a substrate with the substrate holder 128. The third joint 120 can support the third linkage 124 in addition to the substrate holder 128. The third joint 120 may be used to manipulate a position and orientation of the substrate holder 128 by enabling the first end 124a of the third linkage 124 to be rotated about the third joint.

One or more of the joints 104, 112, 120, and/or linkages 108, 116, 124 may be constructed of any appropriate material such as metal, polymer or combinations thereof, and may be solid, hollow or include any appropriate cross-sectional shape to optimize the dynamics of the substrate scanning device 100. The joints and linkages may also include features for protecting and routing various power cables, communication cables and fluid tubes between different components of the substrate scanning device 100. Such cabling and tubing may be used to power, control, heat, and cool one or more aspects of the substrate scanning device 100.

It will be appreciated that while the illustrated embodiment of the substrate scanning device 100 includes three individual joints, three individual linkages, and one substrate holder 128, other combinations of joints and linkages are contemplated without departing from the scope of the disclosure. For example, the number and positioning of the joints, linkages, and/or substrate holder may be varied without departing from the scope of the present disclosure.

Figure 2:
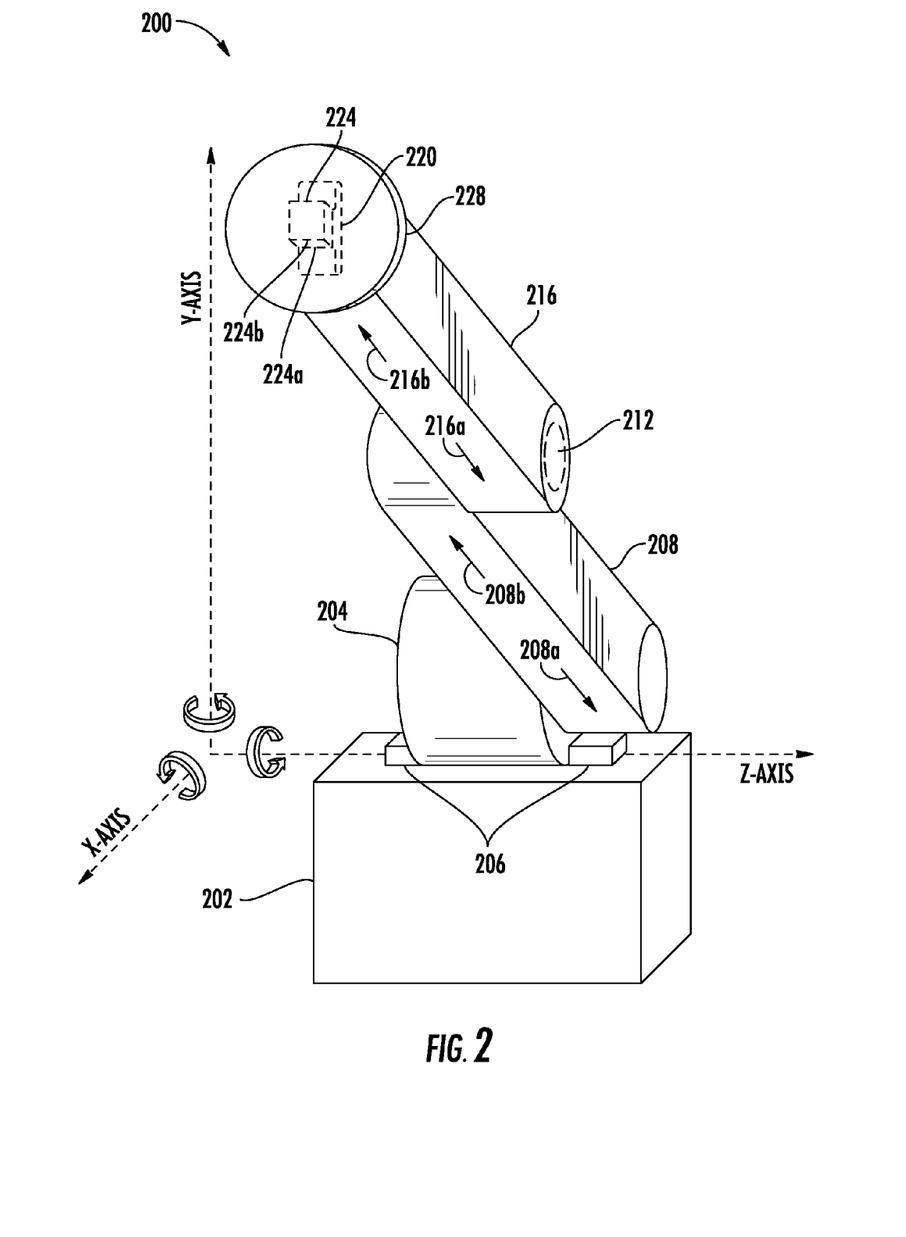
FIG. 2 is an isometric front view illustrating an exemplary substrate scanning device and a corresponding mounting structure in accordance with an embodiment of the present disclosure.

Referring now to FIG. 2a, a substrate scanning device 200 and a mounting structure 202 consistent with a non-limiting, exemplary embodiment of the present disclosure is shown. The substrate scanning device 200 may include a first joint 204, a second joint 212, a third joint 220, and a substrate holder 228. The first, second and third joints 204, 212, 220 may be connected by a first linkage 208 and a second linkage 216, respectively. The third joint 220 may be coupled to the substrate holder 228 by a third linkage 224.

The first joint 204 of the substrate scanning device 200 may couple to a mounting structure 202 via one or more mounting point(s) 206. The mounting structure 202 can provide support to components of the substrate scanning device 200 by rigidly coupling to the first joint 204 via one or more mounting points 206. The mounting points 206 may comprise any of a variety of connection methods such as one or more bolts, pins, or other appropriate mechanical connectors. In some embodiments, the mounting structure 202 may be part of, or may be coupled to, a surface of a process chamber (not shown). In other embodiments, the mounting structure 202 may be coupled to a movable platform such as a rail system or a removable platform secured to the process chamber by one or more connection methods such as one or more of a bolt, pin, and/or bracket. In one non-limiting example, the first joint 204 is integral with the mounting structure 202.

In some embodiments the first joint 204 can include a motor sized to produce sufficient torque to accommodate the moment created by components of the substrate scanning device 200 supported by the first joint 204 so that a first end 208a of the first linkage 208 can be rotated about the first joint 204. In some embodiments, the motor may be an electric motor such as a direct drive motor. The direct drive motor associated with the first joint 204 may provide torque directly to the first linkage 208 to rotate the first end 208a of the first linkage 208 by a desired displacement at a desired velocity and acceleration. The first joint 204 maybe coupled to the second joint 212 by a second end 208b of the first linkage 208.

The second joint 212 may include a motor, which in one exemplary non-limiting embodiment may be a gear motor. In some embodiments the gear motor may be a planetary gear motor, a harmonic drive motor, or a cycloidal gear motor. In some embodiments the gear motor may include one or more gear reductions. The second joint 212 may couple to a first end 216a of the second linkage 216. The gear motor associated with the second joint 212 can be sized to produce sufficient torque to accommodate the moment created by components of the substrate scanning device 200 supported by the second joint 212 so that the first end 216a of the second linkage 216 may be rotated about the second joint 212. The motor associated with the second joint 212 may be selected to be low in weight relative to a direct drive motor with equivalent torque in order to enhance the kinematics of the substrate scanning device 200.

A second end 216b of the second linkage 216 may couple to the third joint 220. The third joint 220 can include a motor connected to the substrate holder 228 by a third linkage 224. The motor associated with the third joint 220 may be sized to produce sufficient torque to accommodate the moment created by the third linkage 224 and the substrate holder 228, so that the first end 224a of the third linkage 224 may be rotated about the third joint 220. The motor associated with the third joint 220 may be selected to be low in weight relative to a direct drive motor with equivalent torque so as to enhance the kinematics of the substrate scanning device 200. In one exemplary non-limiting embodiment the motor associated with the third joint 220 may be a gear motor such as a planetary gear motor, a harmonic drive motor, or a cycloidal gear motor. In some embodiments the gear motor may include one or more stages of gear reduction.

In some embodiments the motors associated with the first and second joints 204, 212 may be of a different motor type, while the motors associated with the second and third joints 212, 220 may be of a similar motor type. For example, the motor associated with the first joint 204 may be a direct drive motor, while the motors associate with the second and third joints 212, 220 may be gear motors.

It will be appreciated that while the illustrated embodiment of the substrate scanning device 200 employs joints comprising motors in the manners described above, other motor arrangements can additionally or alternatively be implemented. For example, a motor may comprise the joint and include a vacuum seal and a support bearing. In some embodiments, the second joint 212 and/or third joint 220 may be a gear motor with a built-in vacuum seal and support bearing to support the link. It is further contemplated that one or more joints 204, 212, 220 may be assembled from a plurality of discrete components without departing from the present disclosure.

Figure 3A:
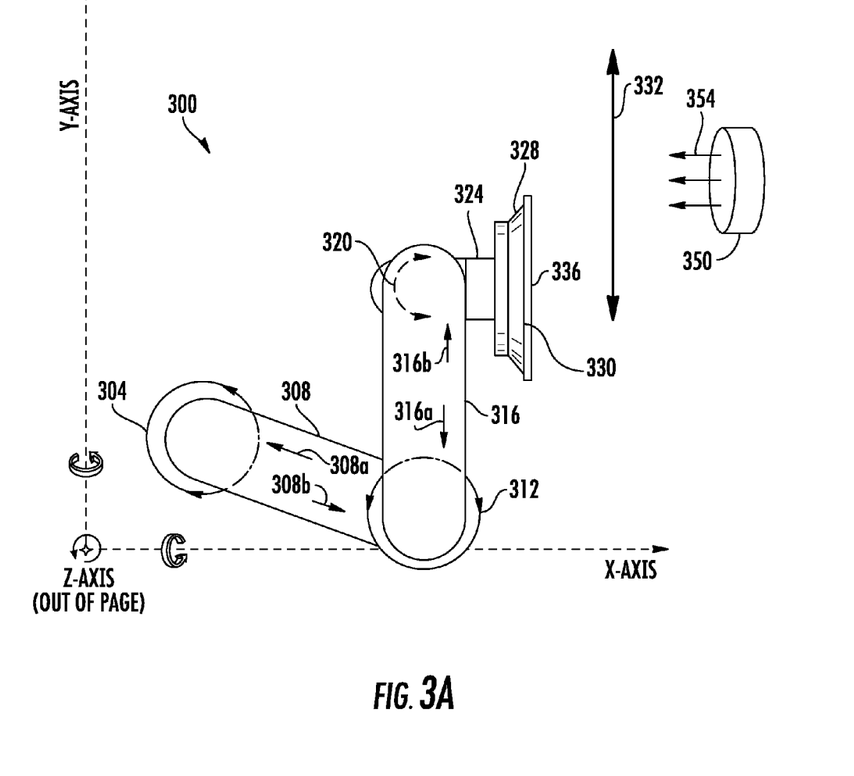
FIG. 3a is a side view illustrating an exemplary substrate scanning device in a first position in accordance with an embodiment of the present disclosure.

Referring now to FIG. 3a, a substrate scanning device 300 is shown in a first position consistent with a non-limiting, exemplary embodiment of the present disclosure is shown. The substrate scanning device 300 can include first, second, and third joints 304, 312, 320, first, second, and third linkages 308, 316, 324, and a substrate holder 328 which may be configured the same as, or similar to, the like-named elements described in relation to FIGS. 1 and 2.

For example, the first, second, and third joints 304, 312, 320 each may include a motor. In some embodiments the first joint 304 includes a direct drive electric motor while the second and third joints 312, 320 each includes a gear motor. The first, second, and third joints 304, 312, 320 can be operated together to move the substrate holder 328 along a scan axis 332 while maintaining a face 330 of the substrate holder 328 perpendicular to the X-axis. It will be appreciated that when the substrate scanning device 300 is employed as part of an ion implantation system, an ion beam 354, originating from an ion source 350, can be directed along the X-axis toward the substrate holder 328. Thus, the first, second and third joints 304, 312, 320 may be manipulated to ensure that the face 330 of the substrate holder 328 (and a substrate 336 mounted thereon) are oriented perpendicular to the ion beam 354 as the substrate holder 328 is scanned in a direction perpendicular to the ion beam (i.e., along scan axis 332).

As noted, when the substrate scanning device 300 is used as part of an ion implantation device, an ion beam 354 may be oriented along the X-axis toward a substrate 336 coupled to the substrate holder 328. In one non-limiting exemplary embodiment the substrate 336 can be a semiconductor substrate. As will be appreciated, the substrate scanning device 300 may facilitate the implanting of ions into the substrate 336 by exposing the substrate to the ion beam 354. Thus, the substrate scanning device may be configured to expose portions of the substrate 336 to the ion beam 354 by scanning the substrate 336 through the ion beam 354 at a desired constant velocity. By minimizing fluctuations in the scanning velocity, variations in ion implantation can be minimized across the surface of the substrate. In some embodiments, the substrate scanning device 300 can scan the substrate at a constant velocity as the substrate is being exposed to the ion beam 354. Thus, the substrate scanning device 300 thereby may contribute to a uniform doping of the substrate 336. For embodiments in which the substrate scanning device 300 is employed in ion implant operations, the substrate scanning device and the substrate 336 may be disposed within a process chamber.

In one non-limiting exemplary embodiment, the first joint 304 may be used to move the substrate holder 328 along the scan axis 332 while the second and third joints 312, 320 may be used to maintain the face 330 of the substrate holder 328 perpendicular to the X-axis (i.e., the direction of travel of the ion beam 354) at a constant distance from the ion source 350 as the substrate holder 328 is moved along the scan axis 332. In the illustrated embodiment, the scan axis 332 is also parallel to the Y-axis, although this is not necessary and other orientations are contemplated.

Figure 3B:
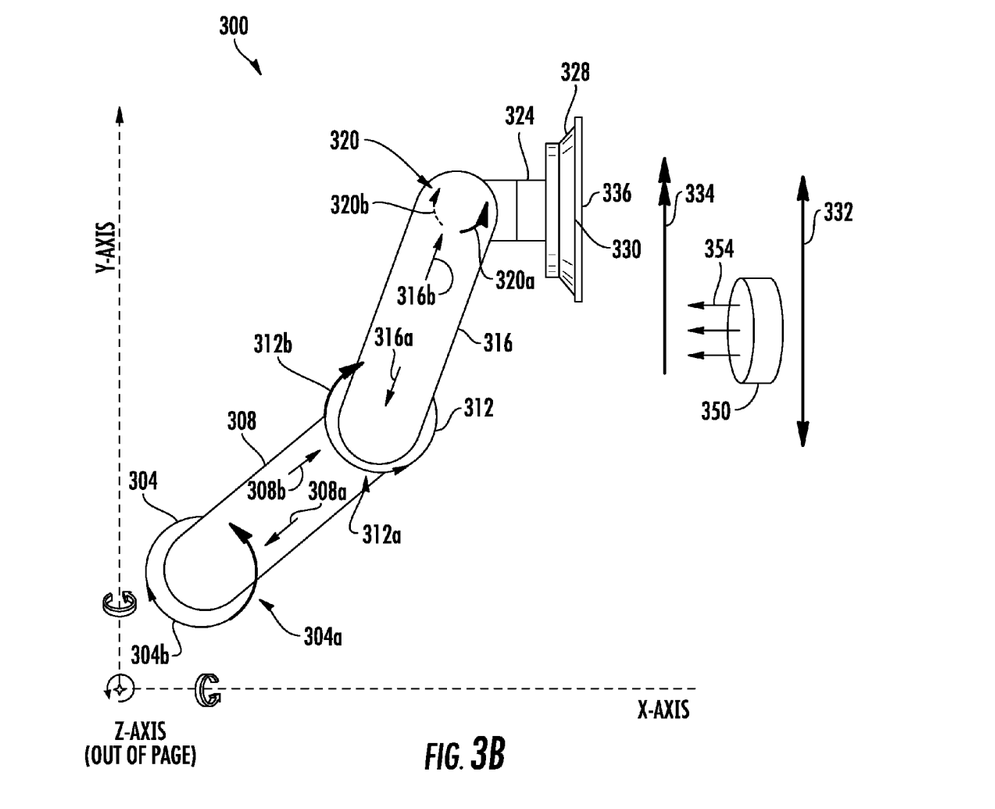
FIG. 3b is a side view illustrating an exemplary substrate scanning device in a second position in accordance with an embodiment of the present disclosure.

Referring now to FIG. 3b, the substrate scanning device 300 is shown in a second position as compared to the position shown in FIG. 3a. Thus, the two figures illustrate the manner in which the substrate scanning device 300 can operate to move the substrate holder 328 along the scan axis 332 in a scan direction 334 during, for example, and ion implantation process.

Thus, in order to move the substrate holder 328 in a first direction along the scan axis 332, the first joint 304 may rotate the first link 308 about the Z-axis in a first direction 304a, which in the illustrated embodiment may tend to move the substrate holder 328 upward and inward along an arced path in the X-Y plane. To compensate for this arced path, the second joint 312 may rotate the second link 316 in either a first direction 312a or second direction 312b about the Z-axis.

In the illustrated embodiment the second joint 312 has rotated the second link 316 in the second direction 312b. This motion tends to translate the upward and inward movement imparted by the rotation of the first link 308 into a linear upward movement of the second end 316b of the second link 316 (i.e., movement along the Y-axis and the scan axis 332 with a consistent X-coordinate).

It will be appreciated that the direction which the second joint 312 rotates (to maintain the motion of the second link 316 predominantly along the Y-axis) may depend on the angle that the first link forms with the X-axis and the desired direction of travel of the substrate holder 328. Thus, when the angle formed between the first linkage 308 and the X-axis is between −90 degrees and 0 degrees, the second link 316 may rotate in the first direction 312a about the second joint 312. By contrast, when the angle formed between the first linkage 308 and the X-axis is between 0 degrees and 90 degrees, the second link 316 may rotate in the second direction 312b about the second joint 312. This combined rotation enables the second end 316b of the second link 316 as well as the third joint 320 and the substrate holder 328 to be held at a constant X-coordinate value as the substrate holder 328 moves along the scan axis 332.

The third joint 320 can be employed to maintain the face 330 of the substrate holder 328 at a consistent angle with respect to the X-axis by rotating the third link 324 about the third joint in either a first direction 320a or second direction 320b. Thus, the third linkage 324 may be rotated about the third joint 320 in the first direction 320a when the angle formed between the first linkage 308 and the X-axis is between 0 degrees and 90 degrees, while the third linkage 324 may be rotated about the third joint 320 in the second direction 320b when the angle formed between the first linkage 308 and the X-axis is between −90 degrees and 0 degrees.

Figure 3C:
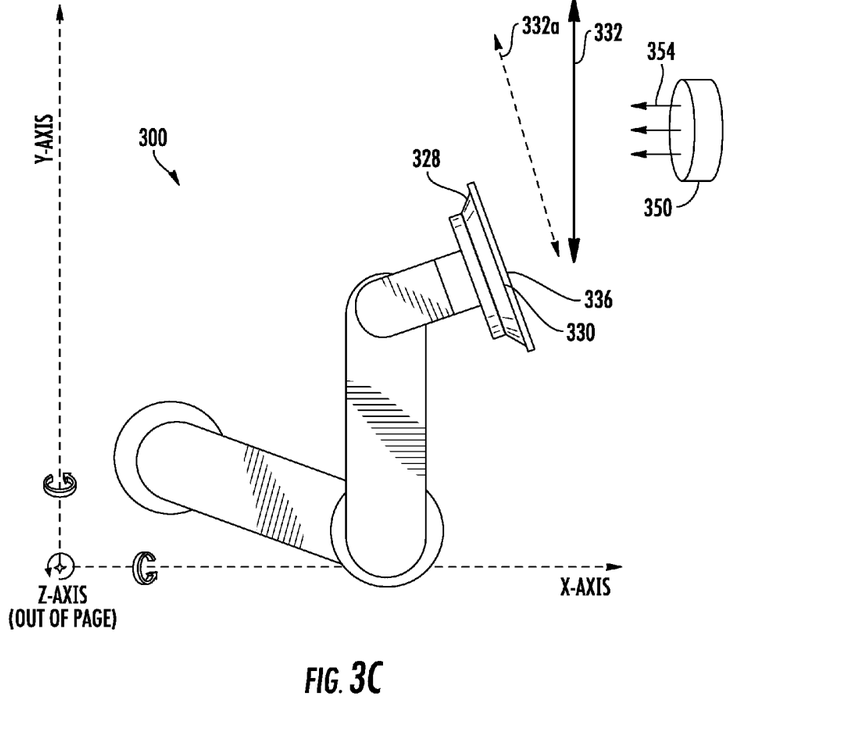
FIG. 3c is a side view illustrating an exemplary substrate scanning device in a third position in accordance with an embodiment of the present disclosure.

Referring now to FIG. 3c, the substrate scanning device 300 is shown in an orientation consistent with a non-limiting, exemplary embodiment of the present disclosure. The substrate scanning device 300 can include a substrate holder 328 and a substrate 336 coupled to a face 330 of the substrate holder 328 which may be configured the same as, or similar to, the like-named elements described in relation to FIGS. 1-3b. It will be appreciated that when the substrate scanning device 300 is employed as part of an ion implantation system, an ion beam 354, originating from an ion source 350, can be directed along the X-axis toward the substrate holder 328.

As shown, the substrate scanning device 300 may be manipulated to ensure that the face 330 of the substrate holder 328 (and a substrate 336 mounted thereon) are oriented with an oblique angle with respect to the oncoming ion beam 354 as the substrate holder 328 is scanned in a direction perpendicular to the ion beam (i.e., along scan axis 332). For example, the face 330 of the substrate holder 328 may be held at an oblique angle with respect to the oncoming ion beam 354, where that oblique angle may be between 0 and 90 degrees. In other embodiments, the substrate scanning device 300 may be manipulated to ensure that the face 330 of the substrate holder 328, and a substrate 336 mounted thereon, are oriented at a perpendicular angle with respect to the oncoming ion beam 354 as the substrate holder 328 is scanned in a direction perpendicular to the ion beam (i.e., along scan axis 332). It will be appreciated that although the scan axis 332 is shown as being perpendicular to the ion beam 354, in some embodiments the scan axis (shown as dashed arrow 332a) can be oriented at an oblique angle with respect to the ion beam.

Figure 4:
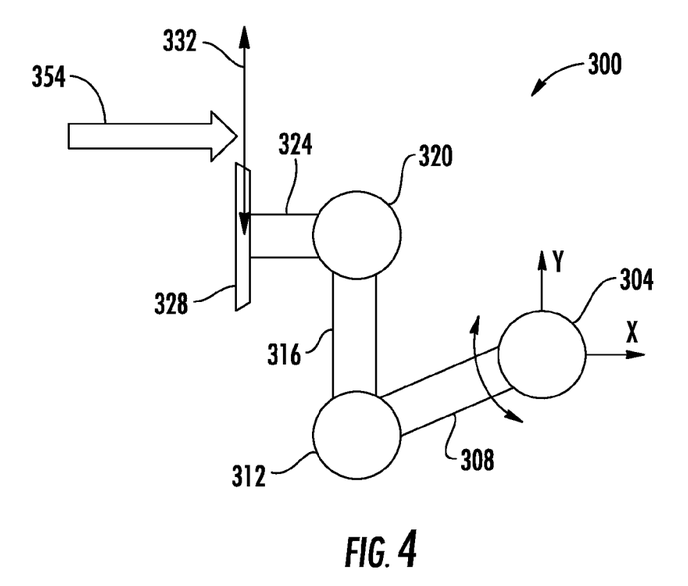
FIG. 4 is a side view illustrating an exemplary substrate scanning device according to an embodiment of the present disclosure.
Figure 5:
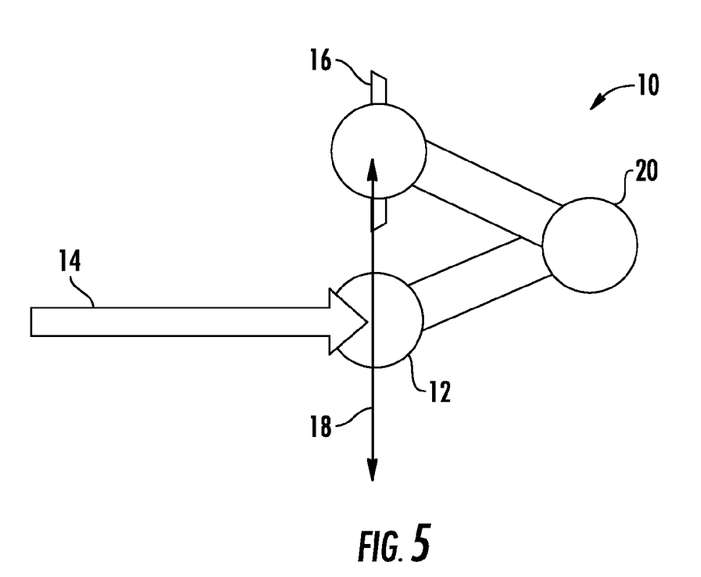
FIG. 5 is a side view illustrating a known substrate scanning device.

Referring now to FIGS. 4 and 5, the arrangement and performance enhancements achieved by the disclosed system will be described in relation to a known scanning device. Although this comparison will proceed in relation to the substrate scanning device 300 shown in FIGS. 3a-3c, it will be appreciated that the comparison will apply equally to each of the other embodiments disclosed in the present application.

As can be seen in FIG. 4, the first, second and third joints 304, 312, 320 and the first, second and third linkages 308, 316, 324 can be positioned with the process chamber (not shown) so that the first joint 304 is offset from the ion beam 354. The first joint 304 may be coupled directly to a wall or other structure of the process chamber. The first joint 304 may also be offset from the ion beam 354, which, as will be described, provides an arrangement in which a majority of the motion of the substrate holder 328 along the scan axis 332 is due to the rotation of the first joint 304. As can be seen in the known scanning device 10 shown in FIG. 5, the first joint 12 is aligned with the ion beam 14, which results in an arrangement in which a majority of the motion of the substrate holder 16 along the scan axis 18 is due to a combination of the rotation of the first and second joints 12, 20 In the FIG. 5 arrangement, the motion of the substrate holder 16 along the scan axis is 18 due more to the motion of the second joint 20 than the first joint 12. As will be appreciated, this means that velocity fluctuations in the motion provided by rotation of the second joint 20 will impact the velocity of the substrate holder 16 more than velocity fluctuations in the rotation of the second joint 312 of the disclosed substrate scanning system 300.

With the disclosed substrate scanning system 300 arrangement the velocity of the substrate holder 328 (and thus a carried substrate) along the scan axis 332 is primarily controlled through the rotation of the first joint 304. That is, rotation of the first joint 304 contributes to more movement of the substrate holder 328 along the scan axis 332 than the rotation of the second and third joints 312, 320.

As a result, the disclosed system positions a large direct drive motor at the first joint 304, which is attached to the process chamber and which drives the first link 308 primarily along the scan axis 332 (e.g., along the y axis). Since this motor is physically attached to the process chamber, its size and mass are not limited and do not negatively impact the scanning velocity of the substrate holder 328. As noted, rotation of the second and third joints 312, 320 contribute less to the movement of the substrate holder 328 along the scan axis 332, rather, the second and third joints function to maintain the substrate at a predetermined position in space orthogonal to the scanning direction 332, and at a predetermined angle relative to the ion beam 354. Since the second and third motors are "carried" by the first motor, the second and third motors should be as light and small as practical to decrease the torque requirements on the first motor and to decrease the overall size of the substrate scanning device to provide more efficient packaging of the complete system. Thus, the substrate scanning system 300 employs gear motors at the second and third joints 312, 320.

As mentioned, the motor associated with the first joint 304 may controllably support the entire weight of the substrate scanning device 300, and thus, the motor associated with the first joint may be a direct drive motor that can generate a relatively high amount of torque. The motors associated with the second and third joints 212, 220, by contrast, may contribute relatively little to the movement of the substrate holder 328 along the scan axis 332, and thus, the motors associated with the second and third joints can be gear motors. It will be appreciated that gear motors can be substantially lighter than direct drive motors that generate equivalent amounts of torque. Thus, by providing the second and third joints 312, 320 with gear motors, the overall weight of the substrate scanning device 300 can be minimized, while generating a desired constant velocity of the substrate holder 328 during scanning.

As will be appreciated, systems that only utilize gear motors suffer from fluctuations in velocity due to the inaccuracies inherent in the manufacturing of gears. Still, gear motors present advantages in their ability to deliver large torques relative to their size and mass. Therefore, gear motors can be desirable when positioned at joints that are carried by other joints, thus limiting the torque required by the carrying joint. In the disclosed system, a combination of direct drive motors and gear motors are employed to obtain the benefits of both. Selecting the motors in this fashion can also result in a lower cost system as compared to a system made up entirely of direct drive motors.

By selecting the motors associated with the first, second and third joints 304, 312, 320 in this manner, a desired constant velocity scanning of the substrate holder 328 (and associated substrate) can be achieved that has much lower velocity fluctuation than an equivalent system consisting entirely of gear motors.

Figure 6A:
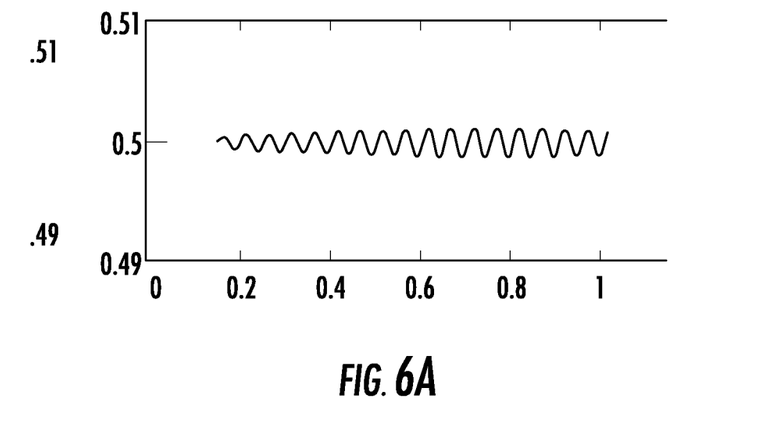
FIGS. 6a and 6b are velocity fluctuation plots representative of the performance of embodiment of the substrate scanning device of FIG. 4 compared to the known scanning device of FIG. 5.
Figure 6B:
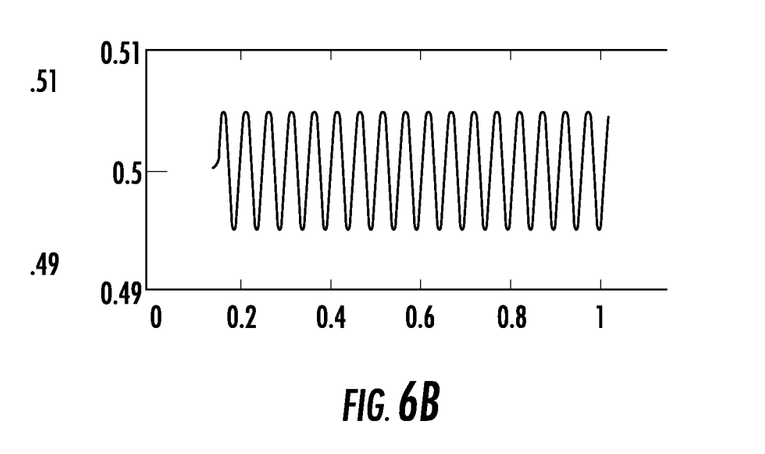

As an example of the improved performance improvement provided by the disclosed arrangement, FIGS. 6a and 6b show a comparison between the disclosed substrate scanning system 300 and the known substrate scanning system 10 of FIG. 5. The X-axis of each graph represents time, in seconds, while the Y-axis of each graph represents velocity in meters/second. As can be seen, a comparison of FIGS. 6a and 6b shows that the geometry of the substrate scanning system 300 (in which the first joint 304 is offset from the ion beam 354) results in more consistent velocity performance (~5× reduction in velocity fluctuation during operation) as compared to the known substrate scanning system 10 (in which the first joint 12 is aligned with the ion beam 14).

Figure 7:
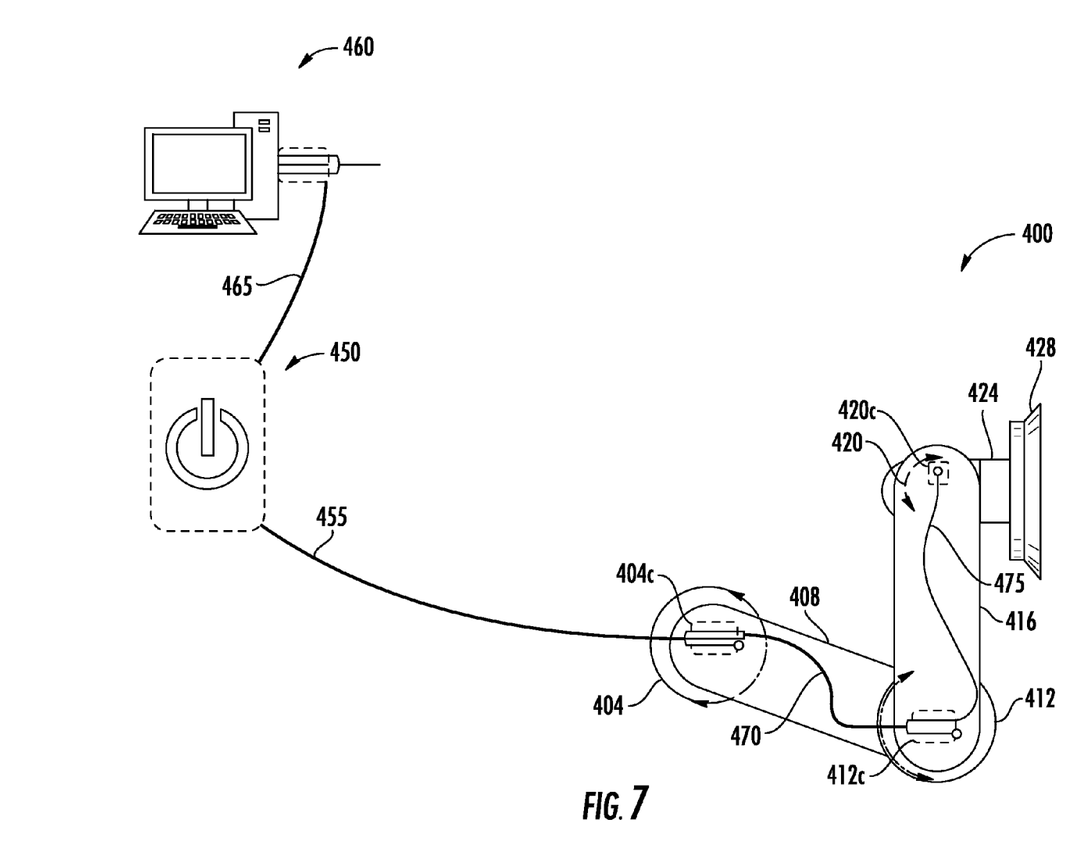
FIG. 7 is a of an exemplary substrate scanning device in conjunction with exemplary power and motion controllers in accordance with an embodiment of the present disclosure.

Referring now to FIG. 7, a control arrangement is illustrated for a substrate scanning device 400. The substrate scanning device 400 of this embodiment can include first, second, and third joints 404, 412, 420, first, second, and third linkages 408, 416, 424, and a substrate holder 428 which may be configured the same as, or similar to, the like-named elements described in relation to FIGS. 1-3b.

The substrate scanning device 400 can include a first joint 404 connected to a second joint 412 by a first linkage 408. The second joint 412 may be connected by a second linkage 416 to a third joint 420. A substrate holder 428 may be connected to the third joint 420 by a third linkage 424. In some embodiments, a motor may be included in each of the first, second, and third joints 404, 412, 420 with each joint including, respectively, a motor controller 404c, 412c, 420c. Although the motor controllers 404c, 412c, 420c are shown as being individually located at their associated motors, it will be appreciated that they can instead be consolidated or part of a single motor controller 450 which can provide power to the motors as instructed or requested by a motion controller 460 via communication channel 465. In some embodiments, the substrate scanning device 400 may include a power line 455, a first supply line 470, and a second supply line 475 for communicating power and control signals to the motors from the motor controller 450 and the motion controller 460.

The motion controller 460 can send control signals to the motor controller 450 (or motor controllers 404c, 412c, 420c where multiple individual controllers are used) via the communication channel 465, which in non-limiting exemplary embodiments may be a wireless and/or hard-wired communications link. The motor controller 450 (or 404c, 412c, 420c) may regulate an amount of power received by the respective motor in response to the control signals. In some embodiments, the motor controller 450 (or motor controllers 404c, 412c, 420c) may receive sensor data, such as motor position, from the motors. The motion controller 460 may receive sensor data, such as motor position and power state, from the motors and/or motor controller 450 (or 404c, 412c, 420c). The motion controller 460 can include a computer or computer system for creating the control signals.

Thus arranged, the motors associated with the first, second and third joints 404, 412, 420 may be controlled using the motion controller 460 to scan a substrate coupled to the substrate holder 428 through an ion beam 354 (FIGS. 3a, 3b, 3c) at a desired velocity, and with a desired position and orientation with respect to the ion beam.

It will be appreciated that while the illustrated embodiment of the substrate scanning device 400 employs power and motion controllers in the manner described above, other power and motion controllers can additionally or alternatively be implemented. For example, each motor controller 404c, 412c, 420c may be located separate from the joints 404, 412, 420. It is further contemplated that the type and number of connections between the motor controller, motion controller, and motor controllers may be varied without departing from the present disclosure.

It will be appreciated that the substrate scanning devices 100, 200, 300, 400 described herein may include any or all of the features described in relation to the various embodiments.

The various embodiments, components, and methods of the substrate scanning devices and methods described herein, such as creating the control signals, may be implemented as part of one or more computer systems. Such a computer system may include a computer, an input device, a display unit and an interface, for example, for accessing the Internet. The computer may include a microprocessor. The microprocessor may be connected to a communication bus. The computer may also include memories. The memories may include Random Access Memory (RAM) and Read Only Memory (ROM). The computer system further may include a storage device, which may be a hard disk drive or a removable storage drive such as a floppy disk drive, optical disk drive, and the like. The storage device may also be other similar means for loading computer programs or other instructions into the computer system.

The computer system executes a set of instructions that are stored in one or more storage elements, in order to process input data such as sensor data from the substrate scanning device 400. The storage elements may also store data or other information as desired or needed. The storage element may be in the form of an information source or a physical memory element within the processing machine.

The set of instructions may include various commands that instruct the computer as a processing machine to perform specific operations such as the methods and processes of the various embodiments of the invention. The set of instructions may be in the form of a software program. The software may be in various forms such as system software or application software. Further, the software may be in the form of a collection of separate programs, a program module within a larger program or a portion of a program module. The software also may include modular programming in the form of object-oriented programming. The processing of input data by the processing machine may be in response to user commands, or in response to results of previous processing, or in response to a request made by another processing machine.

As used herein, the term "software" includes any computer program stored in memory for execution by a computer, such memory including RAM memory, ROM memory, EPROM memory, EEPROM memory, and non-volatile RAM (NVRAM) memory. The above memory types are exemplary only, and are thus not limiting as to the types of memory usable for storage of a computer program.

Figure 8:
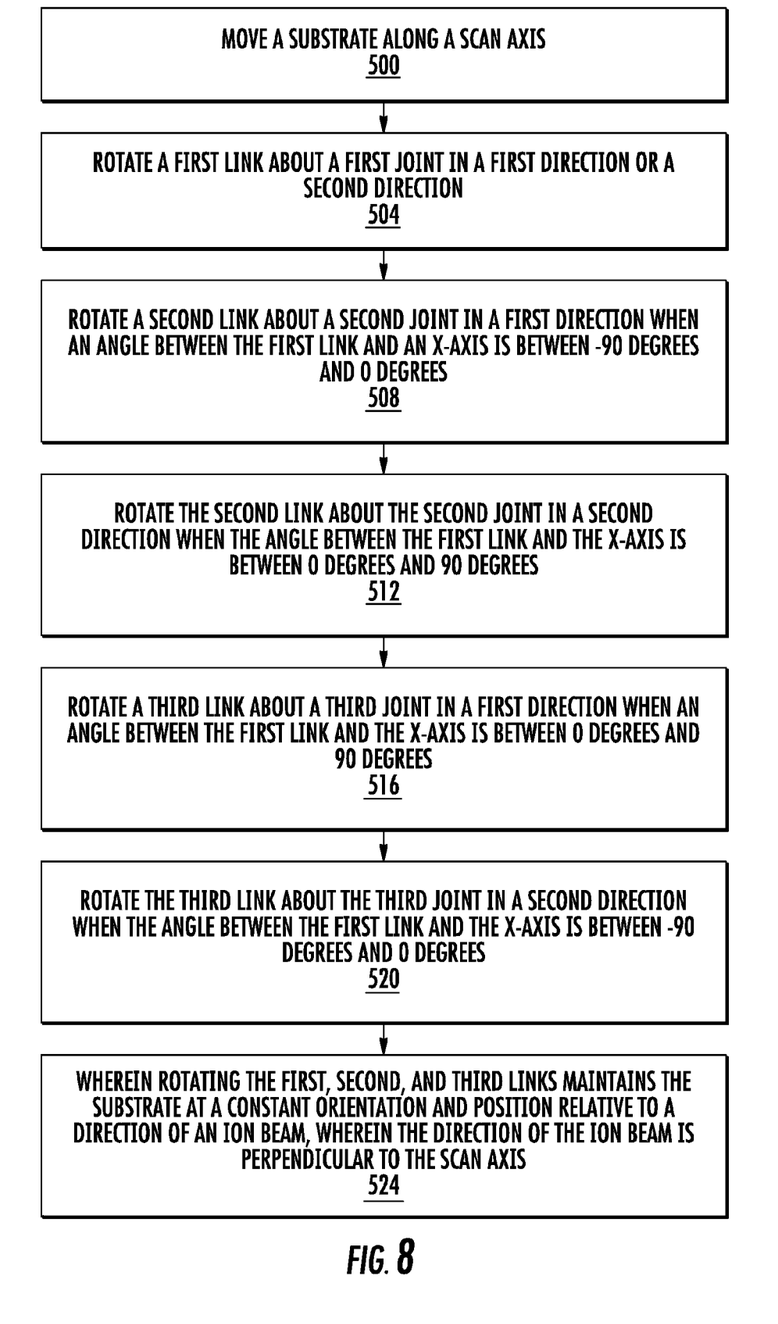
FIG. 8 is a logic diagram illustrating an exemplary method of introducing a substrate to an ion beam in accordance with an embodiment of the present disclosure.

Referring now to FIG. 8, a logic diagram illustrating an exemplary method of introducing a substrate to an ion beam will be described in greater detail. As shown in block 500, a substrate can be moved along a scan axis. In block 504, a first link can rotate in a first direction or a second direction. Proceeding to block 508, a second link can rotate about a second joint in a first direction when an angle between the first link and an X-axis is between −90 degrees and 0 degrees. At block 512, the second link can rotate about the second joint in a second direction when the angle between the first link and the X-axis is between 0 degrees and 90 degrees. In some embodiments, the first link includes rotating the first link using a direct drive motor coupled to a surface of a process chamber.

As shown in block 516, a third link can rotate about a third joint in a first direction when an angle between the first link and the X-axis is between 0 degrees and 90 degrees. Proceeding to block 520, the third link can rotate about the third joint in a second direction when the angle between the first link and the X-axis is between −90 degrees and 0 degrees. At block 524, rotating the first, second, and third links can maintain the substrate at a constant orientation and position relative to a direction of an ion beam, wherein the direction of the ion beam is perpendicular to the scan axis. In some embodiments, the second link includes rotating the second link using a gear motor.

In some embodiments, rotating the first, second, and third links can maintain the substrate at a constant angle relative to the scan axis while the substrate is introduced to the ion beam.

In some embodiments, the first, second, and third joints can be coupled to respective first, second, and third motors, and wherein the first, second, and third motors are controlled via a motion controller to maintain a predetermined scan velocity, position, and orientation of the substrate holder.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Thus, the present disclosure provides substrate scanning devices, substrate scanning devices, and methods for moving substrates, such as substrates, in a linear fashion. An advantage, offered by the devices, systems, and methods of the present disclosure is that they can move a substrate in a straight line with a consistent velocity. Another advantage offered by the devices, systems, and methods of the present disclosure is that they provide very uniform dosing of substrates. A third main advantage offered by the devices, systems, and methods of the present disclosure is that they can substrates in a quick and efficient manner while exceeding requisite quality standards.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that the usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A substrate scanning device comprising:
first, second and third linkages;
a first joint connectable between a process chamber and a first end of the first linkage, wherein the first joint includes a direct drive motor,
a second joint coupled between a second end of the first linkage and a first end of the second linkage, wherein the second joint includes a first gear motor,
a third joint coupled between a second end of the second linkage and a first end of the third linkage, wherein the third joint includes a second gear motor; and
a substrate holder coupled to a second end of the third linkage;
the first joint for moving the substrate holder along a scan axis; and
the second and third joints for maintaining a face of the substrate holder at a constant position and orientation as the first joint moves the substrate holder along the scan axis, wherein radial motion of the first joint displaces the second and third joints in a direction perpendicular to the scan axis.

2. The substrate scanning device of claim 1, wherein the first gear motor and the second gear motor are substantially lighter than direct drive motors capable of generating equivalent amounts of torque.

3. The substrate scanning device of claim 1, wherein the first joint is offset from an axis of an ion beam introduced into the process chamber such that a majority of a velocity of the substrate holder along the scan axis is provided through rotation of the first joint.

4. The substrate scanning device of claim 1, wherein the second and third joints are positioned closer to the substrate holder as compared to the first joint when the substrate holder is moved along the scan axis.

5. The substrate scanning device of claim 1, wherein the substrate holder is movable along the scan axis at a constant velocity using the first, second, and third joints.

6. The substrate scanning device of claim 1, wherein the first joint rotates the first linkage with respect to the process chamber, and the second and third joints rotate the second and third linkages, respectively, with respect to the first linkage.

7. The substrate scanning device of claim 6, wherein the first, second and third linkages are extendible in a direction perpendicular to the scan axis.

8. A substrate scanning device comprising:
a first joint comprising a direct drive motor, the first joint connectable to a process chamber;
a second joint comprising a first gear motor, wherein the first joint and the second joint are connected by a first linkage;
a third joint including a second gear motor, wherein the second joint and the third joint are connected by a second linkage; and
a substrate holder for engaging a substrate, wherein the third joint and the substrate holder are connected by a third linkage;
wherein the first, second and third joints are rotatable via the direct drive motor and the first and second gear motors, respectively, to move the substrate holder along a scan axis.

9. The substrate scanning device of claim 8, wherein the first joint is offset from an axis of an ion beam introduced into the process chamber such that a majority of a velocity of the substrate holder along the scan axis is provided through rotation of the first joint.

10. The substrate scanning device of claim 8, wherein the first gear motor and the second gear motor are substantially lighter than direct drive motors capable of generating equivalent amounts of torque.

11. The substrate scanning device of claim 8, wherein the second joint is arranged to be closer to the substrate holder than the first joint when the substrate is presented to an ion beam.

12. The substrate scanning device of claim 8, wherein the third joint is arranged to be closer to the substrate holder than the first joint when the substrate holder presented to an ion beam.

13. The substrate scanning device of claim 8, wherein when the substrate is moved along the scan axis the first linkage extends, relative to the first joint, in a direction perpendicular to the scan axis.

14. The substrate scanning device of claim 8, wherein the first joint is configured to support a weight of the second and third joints, the substrate holder, and the substrate.

15. A method for introducing a substrate to an ion beam, comprising:
    moving a substrate along a scan axis,
    rotating a first link about a first joint in a first direction or a second direction;
    rotating a second link about a second joint in a first direction when an angle between the first link and an X-axis is between −90 degrees and 0 degrees,
    rotating the second link about the second joint in a second direction when the angle between the first link and the X-axis is between 0 degrees and 90 degrees;
    rotating a third link about a third joint in a first direction when an angle between the first link and the X-axis is between 0 degrees and 90 degrees; and
    rotating the third link about the third joint in a second direction when the angle between the first link and the X-axis is between −90 degrees and 0 degrees;
    wherein rotating the first, second, and third links maintains the substrate at a constant orientation and position relative to a direction of an ion beam, wherein a direction of an ion beam is perpendicular to the scan axis.

16. The method of claim 15, wherein rotating the first, second, and third links maintains the substrate at a constant angle relative to the scan axis while the substrate is introduced to the ion beam.

17. The method of claim 15, wherein rotating the first link comprises rotating the first link using a direct drive motor coupled to a surface of a process chamber.

18. The method of claim 17, wherein rotating the second link comprises rotating the second link using a gear motor.

19. The method of claim 18, wherein rotating the first link comprises rotating the third link using a gear motor.

20. The method of claim 15, wherein the first, second and third joints comprise respective first, second and third motors, and wherein the first, second and third motors are controlled via a motion controller to maintain a predetermined scan velocity, position, and orientation of a substrate holder.

* * * * *